US009768347B2

(12) United States Patent
Teo et al.

(10) Patent No.: US 9,768,347 B2
(45) Date of Patent: Sep. 19, 2017

(54) HIGH SPEED SURFACE PLASMON COUPLED LIGHT EMITTING DIODES

(71) Applicants: Agency for Science, Technology and Research, Singapore (SG); National University of Singapore, Singapore (SG)

(72) Inventors: Ee Jin Teo, Singapore (SG); Jinghua Teng, Singapore (SG); Chengyuan Yang, Singapore (SG); Andrew Bettiol, Singapore (SG)

(73) Assignees: Agency for Science, Technology and Research, Singapore (SG); National University of Singapore, Singapore (SG)

( * ) Notice: Subject to any disclaimer, the term of this patent is extended or adjusted under 35 U.S.C. 154(b) by 0 days.

(21) Appl. No.: 14/787,122

(22) PCT Filed: Apr. 28, 2014

(86) PCT No.: PCT/SG2014/000190
§ 371 (c)(1),
(2) Date: Oct. 26, 2015

(87) PCT Pub. No.: WO2014/175837
PCT Pub. Date: Oct. 30, 2014

(65) Prior Publication Data
US 2016/0087143 A1    Mar. 24, 2016

(30) Foreign Application Priority Data
Apr. 26, 2013  (SG) .................. 201303250

(51) Int. Cl.
*H01L 33/06* (2010.01)
*H01L 33/00* (2010.01)
(Continued)

(52) U.S. Cl.
CPC ............ *H01L 33/06* (2013.01); *H01L 33/007* (2013.01); *H01L 33/22* (2013.01); *H01L 33/32* (2013.01);
(Continued)

(58) Field of Classification Search
CPC ....... H01L 33/007; H01L 33/06; H01L 33/22; H01L 33/32; H01L 33/38; H01L 33/50
See application file for complete search history.

(56) References Cited

U.S. PATENT DOCUMENTS

| 5,779,924 A * | 7/1998 | Krames | .................. H01L 33/20 216/24 |
| 2007/0190676 A1 * | 8/2007 | Chu | ........................ H01L 33/22 438/22 |

(Continued)

FOREIGN PATENT DOCUMENTS

| CN | 102800771 | 11/2012 |
| KR | 1020110103686 | 9/2011 |
| WO | WO-2014/175837 | 10/2014 |

OTHER PUBLICATIONS

"International Application No. PCT/SG2014/000190, International Preliminary Report on Patentability mailed Aug. 31, 2015", (Aug. 31, 2015), 26 pgs.

(Continued)

*Primary Examiner* — Allan R Wilson
(74) *Attorney, Agent, or Firm* — Schwegman Lundberg & Woessner, P.A.

(57) ABSTRACT

A light emitting diode device (LED) is provided. The LED comprises a first-doped layer on a substrate, an active layer on the first-doped layer, a second-doped layer on the active layer, and a metal layer on the second-doped layer. The second-doped layer is patterned on a surface opposite to the active layer to define a first portion and a second portion. The first portion of the second-doped layer has a first portion thickness constrained for electron-hole pairs in the active layer to couple efficiently to a surface plasmon mode at an interface of the metal layer and the second-doped layer thereby increasing the spontaneous emission rate of the LED. The second portion of the second-doped layer has a (Continued)

second portion thickness sufficient to ensure formation of a p-n junction in the LED.

16 Claims, 19 Drawing Sheets

(51) Int. Cl.
    *H01L 33/22*     (2010.01)
    *H01L 33/32*     (2010.01)
    *H01L 33/38*     (2010.01)
    *H01L 33/50*     (2010.01)

(52) U.S. Cl.
    CPC .............. *H01L 33/38* (2013.01); *H01L 33/50* (2013.01); *H01L 2933/0016* (2013.01); *H01L 2933/0025* (2013.01)

(56) References Cited

U.S. PATENT DOCUMENTS

| | | | |
|---|---|---|---|
| 2009/0087994 A1* | 4/2009 | Lee | H01L 21/30617 438/704 |
| 2009/0250685 A1* | 10/2009 | Moon | H01L 33/02 257/13 |
| 2011/0156000 A1* | 6/2011 | Cheng | H01L 33/22 257/13 |
| 2011/0233514 A1* | 9/2011 | Lu | H01L 33/20 257/13 |
| 2011/0309400 A1* | 12/2011 | Fukushima | H01L 21/0237 257/98 |
| 2014/0225139 A1* | 8/2014 | Park | H01L 33/58 257/98 |
| 2016/0118540 A1* | 4/2016 | Dong | H01L 33/32 257/13 |

OTHER PUBLICATIONS

"International Application No. PCT/SG2014/000190, International Search Report and Written Opinion mailed Jul. 28, 2014", (Jul. 28, 2014), 14 pgs.

Koike, Kayo, et al., "Improvement of Light Extraction Efficiency and Reduction of Leakage Current in GaN-Based LED Via V-Pit Formation", IEEE Photonics Technology Letters, vol. 24, No. 6, 449-451, (Mar. 15, 2012), 449-451.

* cited by examiner

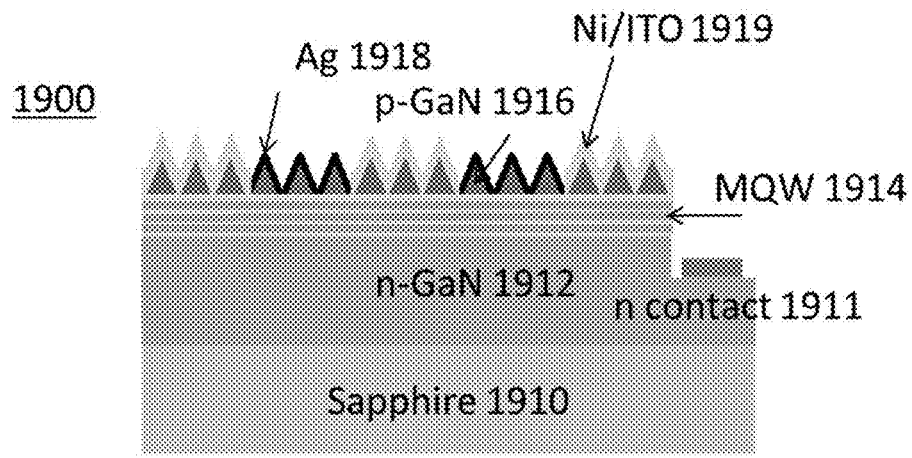
FIG. 19A
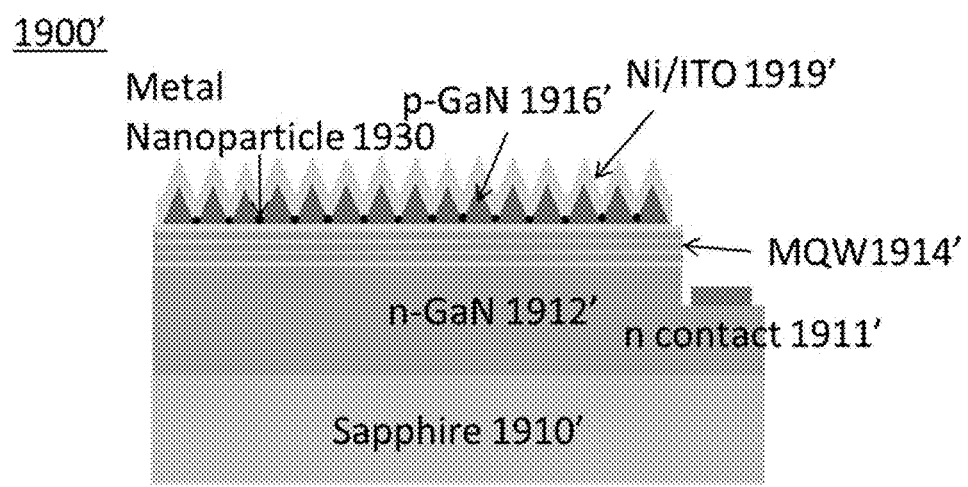
FIG. 19B
FIG. 19

US 9,768,347 B2

HIGH SPEED SURFACE PLASMON COUPLED LIGHT EMITTING DIODES

PRIORITY CLAIM

This application is a U.S. national stage application filed under 35 U.S.C. §371 from International Application Serial No. PCT/SG2014/000190, which was filed 28 Apr. 2014, and published as WO2014/175837 on 30 Oct. 2014, and which claims priority to Singapore Patent Application No. 201303250-3, filed 26 Apr., 2013, which applications and publication are incorporated by reference as if reproduced herein and made a part hereof in their entirety, and the benefit of priority of each of which is claimed herein.

FIELD OF THE INVENTION

The present invention generally relates to light emitting diodes, and more particularly relates to devices and methods for high speed surface plasmon coupled light emitting diodes.

BACKGROUND

Light emitting diodes (LEDs) have been developed for the next generation of visible light communication (VLC) in addition to improved LEDs for illumination. This means that communication to and from LED based infrastructures such as traffic lights, lamps, car headlights, street lights and electronic posters is now possible and would provide an alternative form of communication in RF-restricted domains, such as airplanes, military applications, subsea equipments and hospitals.

For VLC, high brightness LEDs with the ability to switch on and off quickly is required to transmit large volumes of data over large distances. However the slow spontaneous emission (SE) (e.g., in the range of 2-4 ns) from LEDs places a fundamental limit on their modulation speed to 250 MHz to 500 MHz. In order to push the speed towards the GHz or even multi-GHz range, it is necessary to increase the intrinsic SE rate. One approach is to increase the dopant concentration of the active material. By using a heavily doped active region (e.g., in the range of $10^{19}$ $cm^3$), the carrier radiative lifetime can be reduced to 100 ps, corresponding to 1.6 GHz. However, increasing the dopant concentration also introduces non-radiative recombination centers within the active material, which severely limits the internal efficiency of the LEDs.

By modifying the electromagnetic field in the vicinity of the emitter, it is also possible to increase the SE rate. This is commonly achieved by using a cavity or photonic crystal design. Such a design can be implemented in a microcircuit but scalability is difficult for large scale production. Resonant cavity LEDs, which involve growing a set of Bragg reflectors, can help shorten the lifetime due to resonant cavity effect. However, the enhancement occurs mainly along the cavity axis and emission rates along other directions are not significantly changed. Therefore, the average spontaneous lifetime over all angles is reduced by only 10%.

Using surface plasmon (SP) coupling to increase the SE rate is another approach. This can be done by simply depositing a metal layer, usually Ag, on top of a LED device. The electron-hole pairs in the InGaN quantum wells (QW) can then recombine to form surface plasmons (SP) at the metal/GaN interface instead of being emitted as free photons. In this manner, the electron-hole recombination rate is significantly increased because it emits as a SP instead of a photon. This new path of recombination can also significantly increase the SE rate due to the much higher density of the SP states. However, the SP fringing field at GaN/Ag decreases exponentially with distance from the interface. This places a restriction on the LED device fabrication, as it means that the p-GaN layer will have to be ultrathin. Typically, the thickness of p-GaN needs to be thicker than 76 nm for InGaN LED to maintain the efficiency needed to form a p-n junction in LED.

Thus, what is needed is a high SE-rate LED with high efficiency. Furthermore, other desirable features and characteristics will become apparent from the subsequent detailed description, taken in conjunction with the accompanying drawings and this background of the disclosure.

SUMMARY

According to the Detailed Description, a light emitting diode device (LED) is provided. The LED includes a first-doped layer on a substrate, an active layer on the first-doped layer, a second-doped layer on the active layer, and a metal layer on the second-doped layer. The second-doped layer is patterned on a surface opposite to the active layer to define a first portion and a second portion. The first portion of the second-doped layer has a first portion thickness constrained for electron-hole pairs in the active layer to couple efficiently to a surface plasmon mode at an interface of the metal layer and the second-doped layer thereby increasing the spontaneous emission rate of the LED. The second portion of the second-doped layer has a second portion thickness sufficient to ensure formation of a p-n junction in the LED.

In accordance with another aspect, a method for fabricating a light emitting diode (LED) is provided. The method includes depositing a first-doped GaN layer with first impurities on a substrate, forming one or more quantum well layers on the first-doped layer, depositing a second-doped GaN layer with second impurities on the quantum well layer, selectively etching of the second-doped layer, and depositing a metal layer over the second-doped layer. Depositing the second-doped layer includes depositing the second-doped layer to a thickness to ensure formation of a p-n junction in the LED. Selectively etching of the second-doped layer includes etching selective portions of the second-doped layer to a surface plasmon thickness where electron-hole pairs in the quantum well layer is able to couple efficiently to a surface plasmon mode at an interface of the metal layer and the second-doped layer for an increased spontaneous emission rate of the LED.

In accordance with another embodiment, another method for fabricating a LED is provided. The method includes depositing a first-doped GaN layer with first impurities on a substrate, forming one or more quantum well layers on the first-doped layer, depositing a second-doped GaN layer with second impurities on the quantum well layer, and depositing a metal layer over the second-doped layer. Depositing the second-doped GaN layer includes depositing a first portion of the second-doped GaN layer to have a first thickness and a second portion of the second-doped GaN layer to have a second thickness, the first thickness being defined as a surface plasmon thickness that cause electron-hole pairs in the one or more quantum well layers to couple efficiently to a surface plasmon mode at an interface of the metal layer and the second-doped layer for an increased spontaneous emission rate of the LED and the second thickness being determined to ensure formation of a p-n junction in the LED.

In accordance with yet further embodiment, another method for fabricating a LED is provided. The method includes depositing a first doped layer with the first impurities on a substrate, forming an active layer on the first-doped layer, depositing a second doped layer with the second impurities on the active layer, nanopatterning the second-doped layer, and depositing a metal layer over the second-doped layer. Depositing the second-doped layer includes depositing the second-doped layer to a thickness to ensure formation of a p-n junction in the LED. Nanopatterning the second-doped layer includes nanopatterning portions of the second doped layer to a surface plasmon thickness to cause electron-hole pairs in the quantum well layer to couple efficiently to a surface plasmon mode at an interface between the metal layer and the second-doped layer for an increased spontaneous emission rate of the LED.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment.

FIGS. 3A, 3B and 3C, depicts the surface plasmon coupled LED of FIG. 1 in accordance with the present embodiment, wherein FIG. 3A comprises a perspective three-dimensional view, FIG. 3B comprises a cross sectional view, and FIG. 3C comprises a top planar view.

FIGS. 4A to 4E, depicts steps of a LED fabrication process in accordance with the present embodiment for an LED device with light emission from a polished sapphire substrate outer surface thereof.

FIGS. 5A to 5F, depicts steps of a LED fabrication process in accordance with the present embodiment for an LED device with light emission from a top surface opposite a substrate bottom surface thereof.

FIGS. 6A to 6D depicts graph of luminescence properties of the LED of FIG. 1 in accordance with the present embodiment, wherein FIG. 6A depicts a graph of photoluminescence intensity of LEDs in accordance with the present embodiment, FIG. 6B depicts a graph of electroluminescence intensity of LEDs in accordance with the present embodiment, FIG. 6C depicts a graph of IV curves of LEDs in accordance with the present embodiment wherein an insert depicts an electroluminescence image of an LED emitting from the top surface in accordance with the present embodiment, and FIG. 6D depicts a magnified view of an electroluminescence image of the LED emitting from the top surface in accordance with the present embodiment.

FIGS. 8A, 8B and 8C, depicts graphs of a LED driving signal (FIG. 8A), and output electroluminescence signals from an LED in accordance with the present embodiment before Ag deposition (FIG. 8B) and after Ag deposition (FIG. 8C).

FIGS. 10A, 10B and 10C, depicts perspective three-dimensional illustrations of LEDs in accordance with the present embodiment including various enhancements, wherein FIG. 10A depicts a LED structure including nanoantennas, FIG. 10B depicts a LED structure including nanoapertures, and FIG. 10C depicts a LED structure including nanoparticles.

FIGS. 11A and 11B, depicts a LED in accordance with the present embodiment having an emitting surface covered in phosphors, wherein FIG. 11A depicts a LED having an emitting rear surface covered by phosphors and FIG. 11B depicts a LED having an emitting front surface covered by phosphors.

FIGS. 13A, 13B and 13C, depicts a surface plasmon coupled LED with p-GaN texturing in accordance with the present embodiment, wherein FIG. 13A depicts a cross-sectional view with metal deposition over the exposed portions of the second doped layer and the electrode layer; FIG. 13B depicts a cross sectional SEM view of the textured p-GaN layer, and FIG. 13C depicts a six-step fabrication process for fabricating the SP coupled textured LED.

FIGS. 14A, 14B and 14C, depicts further views of a surface plasmon coupled LED with p-GaN texturing in accordance with the present embodiment, wherein FIG. 14A depicts a top planar SEM view of a textured LED with a three-dimensional perspective of the hexagonal V-pit in an inset, FIG. 14B depicts three cross sectional TEM images, and FIG. 14C depicts a cross-section view of c-plane MQW, thinner MQW and threading dislocations of the LED in accordance with an embodiment.

FIGS. 15A, 15B and 15C, depict photoluminescence (PL) emissions of the LED in accordance with the present embodiment, wherein FIG. 15A depicts a schematic diagram of a time resolved PL emitting setup and a graph of a normalized PL spectrum, FIG. 15B depicts Arrhenius plots of integrated PL intensity for coated and non-coated LEDs, and FIG. 15C depicts corresponding TRPL data of the LED as depicted in FIG. 15B at room temperature.

FIGS. 16A to 16D, depicts operational features of the LED in accordance with the present embodiment, wherein FIG. 16A depicts a schematic diagram of dipole interaction with a metal layer, FIG. 16B depicts electric field distribution images of SP modes excited by the dipole interaction, FIG. 16C depicts a graph of dispersion relation of the metal/GaN interface, and FIG. 16D depicts a graph of propagation length of SP in Ag, Al and Au coated LED, in accordance with an embodiment.

FIGS. 17A to 17D, depicts a LED in accordance with the present embodiment having a AL coated texture and its features, wherein FIG. 17A depicts a cross-sectional view of a LED having the AL coated texture and FIGS. 17B, 17C and 17D depict graphs of PL, normalized PL and Purcell effect of the Al coated textured LED of FIG. 17A.

FIGS. 18A, 18B and 18C, depicts simulations and a graph of features of the LED in accordance with the present embodiment having various surfaces, wherein FIGS. 18A and 18B depict simulations of dipole-SP coupling on a flat surface (FIG. 18A) and a V-pit surface (FIG. 18B), and FIG. 18C depicts a graph of the coupling efficiency with V-pit gap.

And FIG. 19, comprising FIGS. 19A and 19B, depicts a surface plasmon coupled LED with p-GaN texturing in accordance with the present embodiment, wherein FIG. 19 A depicts a cross sectional view with metal deposition over the exposed portions of the second doped layer but not over the electrode layer, FIG. 19B depicts a cross sectional view with metal deposition over the first portion but not the second portion of the second doped layer.

Skilled artisans will appreciate that elements in the figures are illustrated for simplicity and clarity and have not necessarily been depicted to scale. For example, the dimensions of some of the elements in the block diagrams or flowcharts may be exaggerated in respect to other elements to help to improve understanding of the present embodiments.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description. It is the intent of the present embodiment to present a novel high speed surface plasmon coupled light emitting diode (LED). While existing LEDs have slow spontaneous emission rates thereby limiting the modulation speeds thereof, the LED in accordance with the present embodiment has an improved spontaneous emission rate by employing enhanced quantum well and surface plasmon (QW-SP) coupling and thus has an enhanced modulation speed maintaining the LED efficiency. Further, the detailed description will be presented with reference to FIGS. 1 to 19 on the accompanying pages.

Figure 1:
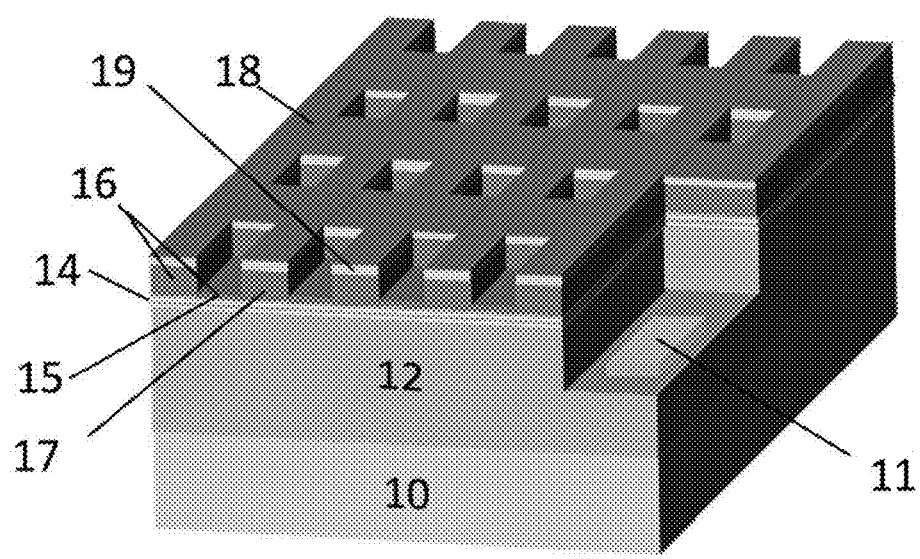
FIG. 1 depicts a perspective view of a light emitting diode (LED) in accordance with a present embodiment.

Referred to FIG. 1, a perspective view of a light emitting diode (LED) 100 in accordance with a present embodiment is depicted. The LED 100 comprises a first-doped layer 12 on a substrate 10, an active layer 14 on the first-doped layer 12, a second-doped layer 16 on the active layer 14, and a metal layer 18 on the second-doped layer 16. The second-doped layer 16 is patterned on a surface opposite to the active layer 14 to define a first portion 15 and a second portion 17. The first portion 15 of the second-doped layer 16 has a first portion thickness constrained for electron-hole pairs in the active layer 14 to couple efficiently to a surface plasmon mode at an interface of the metal layer 18 and the second-doped layer 16 thereby increasing the spontaneous emission rate of the LED 100. The second portion 17 of the second-doped layer 16 has a second portion thickness sufficient to ensure formation of a p-n junction in a LED. Without an extensive discussion of the underlying theory, a surface plasmon mode is a coherent electron oscillation that exists at the interface between a dielectric and a conductor. It can either be localized on a small particle or propagating along the interface.

The first portion 15 of the second-doped layer 16 may have a thickness of less than 50 nm.

The second portion 17 of the second-doped layer 16 may have a thickness of more than 70 nm.

The active layer 14 may comprise one or more quantum well layers comprising material selected from semiconductor emitting material and organic molecules.

The substrate 10 may comprise a material selected from quartz, fused silica, silicon, sapphire and polymer.

The first-doped layer 12 may be an n-doped layer and the second-doped layer 16 may be a p-doped layer.

The first-doped layer 12 may comprise a material selected from the group comprising Si,Ge, SiC, GaAs, InGaP, InGaAs, InGaN, GaN, AlGaN, ZnSe, ZnCdSe, AlGaAs, InP and a molecule doped polymer.

The second-doped layer 16 may comprise a material selected from the group comprising Si,Ge, SiC, GaAs, InGaP, InGaAs, InGaN, GaN, AlGaN, ZnSe, ZnCdSe, AlGaAs, InP and a molecule doped polymer.

The active layer 14 may comprise a material selected from the group comprising Si,Ge, SiC, GaAs, InGaP, InGaAs, InGaN, GaN, AlGaN, ZnSe,Zn CdSe, CdS, AlGaAs and InP.

The metal layer 18 may comprise a metal selected from the group consisting of Au, Ag, Al, Cu, Ti, Ni, Cr, Zn, and an alloy formed from one or more of Au, Ag, Al, Cu, Ti, Ni, Cr, and Zn.

The light may be emitted from a rear side of the LED 100 when the metal layer 18 has a thickness of approximately 30 nm or thicker, wherein the rear side comprises a surface of the substrate 10 opposite the first-doped layer 12.

The light may be emitted from the rear side of the LED 100 and a front side of the LED 100 when the metal layer 18 has a thickness of 5 nm to 30 nm, wherein the front side comprises a surface of the metal layer 18 opposite the electrode layer 19.

The metal layer 18 may be formed on the first portion 15 of the second-doped layer 16 but not on the second portion 17 of the second-doped layer 16. The metal layer 18 may be formed on the first and second portions (15 and 17) of the second-doped layer 16.

The metal layer 18 may comprise a random array of metal nanoparticles formed through annealing or ordered array formed by spincoating of metallic nanoparticles. The metal layer 18 may comprise patterned metallic nanostructures fabricated using lithography and deposition processes.

The second-doped layer 16 may be patterned with plasmonic or metamaterial nanostructures. The second-doped layer 16 may be patterned with a structure of sub-wavelength grating. The second-doped layer 16 may be patterned with a structure of nanoantennas. The second-doped layer 16 may be patterned with a structure of nanoapertures.

The LED 100 may further comprise an electrode pad 11 formed on a portion of the first-doped layer 12 being a first electrode in contact with the first-doped layer 12 and the electrode layer 19 forming a second electrode in contact with the second-doped layer 16. The electrode layer 19 is also known as a current spreading layer.

The LED 100 may further comprise a phosphors layer on a surface of the LED 100.

Figure 2:
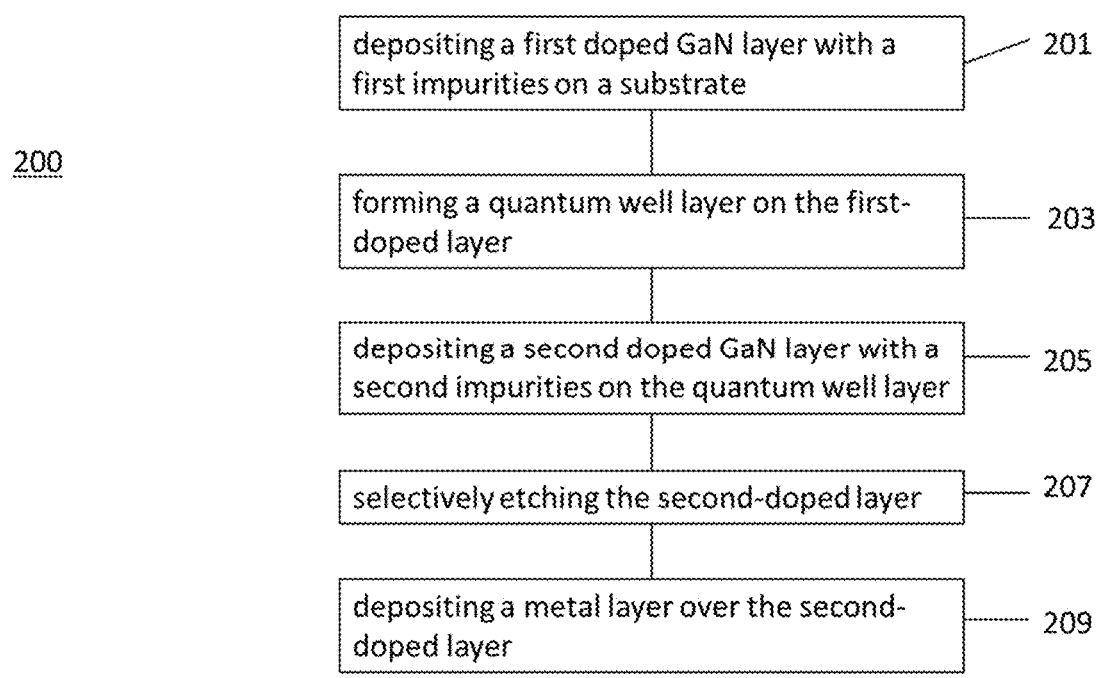
FIG. 2 depicts a flowchart of a method for fabricating the LED of FIG. 1 in accordance with a present embodiment.

Referring to FIG. 2, a method 200 for fabricating a light emitting diode (LED) is depicted in accordance with the present embodiment. The method 200 comprises depositing a first-doped GaN layer with first impurities on a substrate 201, forming a quantum well layer on the first-doped layer 203, depositing a second-doped GaN layer with second impurities on the quantum well layer 205, selectively etching of the second-doped layer 207, and depositing a metal layer over the second-doped layer 209. Depositing the second-doped layer 205 comprises depositing the second-doped layer to a thickness to ensure formation of a p-n junction in a LED. Selectively etching of the second-doped layer 207 comprises etching selective portions of the second-doped layer to a surface plasmon thickness where electron-hole pairs in the quantum well layer couples efficiently to a surface plasmon mode at an interface of the metal layer and the second-doped layer for an increased spontaneous emission rate of the LED.

Selectively etching of the second-doped layer 207 may comprise forming an electrode pad in contact with the first doped layer to form a first electrode, depositing the electrode layer in contact with the second-doped layer to form a second electrode, applying a photoresist layer on the electrode layer, patterning the photoresist layer by lithography so that selective portions of the electrode layer are exposed, removing the exposed selective portions of the electrode layer to reveal portions of the second-doped layer, and etching the exposed portions of the second-doped layer to form a first portion of the second-doped layer having the surface plasmon thickness, a second portion of the second-doped layer having the thickness to ensure formation of a p-n junction in a LED.

Depositing the metal layer over the second-doped layer 209 may comprise depositing over the first and second portions of the second doped layer by removing the photoresist layer before depositing the metal layer over the second-doped layer and the electrode layer. Depositing the metal layer over the second-doped layer 209 may comprise depositing the metal layer over the first portion but not over the second portion of second-doped layer by removing the photoresist layer after depositing the metal layer on the photoresist layer and the first portion of the second-doped layer.

Selectively etching the second doped-layer 207 may comprise etching by inductive plasma etching.

The surface plasmon thickness may be less than 50 nm.

The thickness of the deposited second-doped GaN layer may be more than 70 nm.

The metal layer may have a metal thickness that can be thicker than 30 nm. The metal layer may have a metal thickness that can be thinner than 30 nm.

Selective etching 207 may comprise forming recessed regions of uneven characteristics and random periodicity on the second doped layer.

Depositing the metal layer over the second-doped layer 209 may comprise depositing a phosphor layer on a rear side of the LED, wherein the rear side comprises a surface of the substrate opposite the first-doped layer.

The method 200 may further comprise annealing the metal layer to form a random array of metal nanoparticles.

The method 200 may further comprise self-assembly of metallic nanoparticles.

In accordance with an alternate embodiment, a method for fabricating a light emitting diode (LED) is provided below. The method comprises depositing a first doped layer with first impurities on a substrate, forming an active-layer on the first-doped layer, depositing a second-doped layer with second impurities on the active layer, nanopatterning the second-doped layer, and depositing a metal layer over the second-doped layer. Depositing the second-doped layer comprises depositing the second-doped layer to a thickness to ensure formation of a p-n junction in a LED. Nanopatterning the second-doped layer comprises nanopatterning portions of the second-doped layer to a surface plasmon thickness to cause electron-hole pairs in the active layer to couple efficiently to a surface plasmon mode at an interface between the metal layer and the second-doped layer for an increased spontaneous emission rate of the LED.

Nanopatterning the second-doped layer may comprise creating apertures in the second-doped layer, patterning sub-wavelength grating in the second-doped layer, or nanopatterning by focused ion beam writing, electron beam lithography, nanoimprinting or inductive plasma etching.

A specific example of a LED in accordance with the above embodiment is given in this section. Fabrication of the LED, electrical and optical properties of the LED, and variation thereof are presented below with references to FIGS. 3-12.

Figure 3:
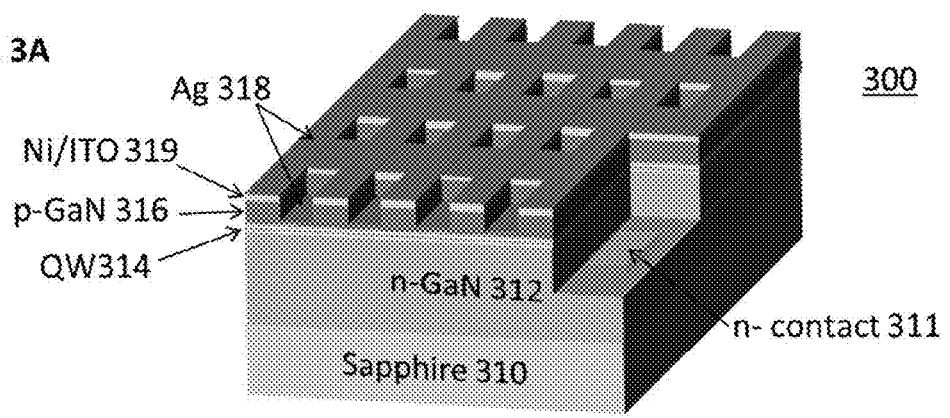
FIG. 3, comprising
Figure 3:
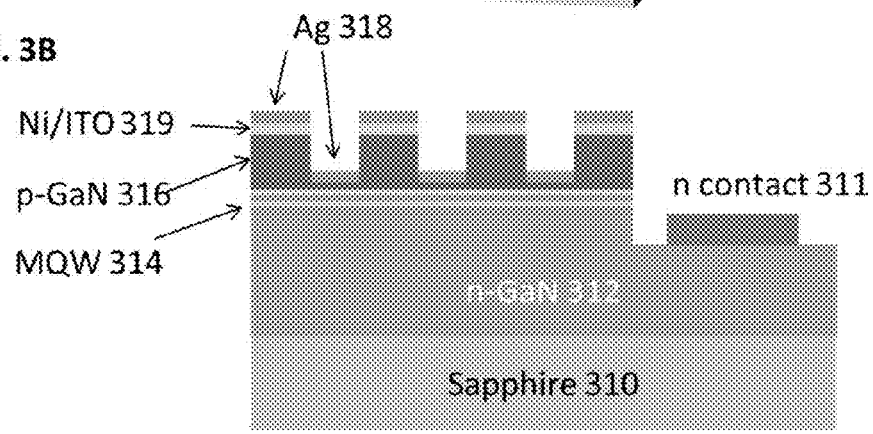
Figure 3:
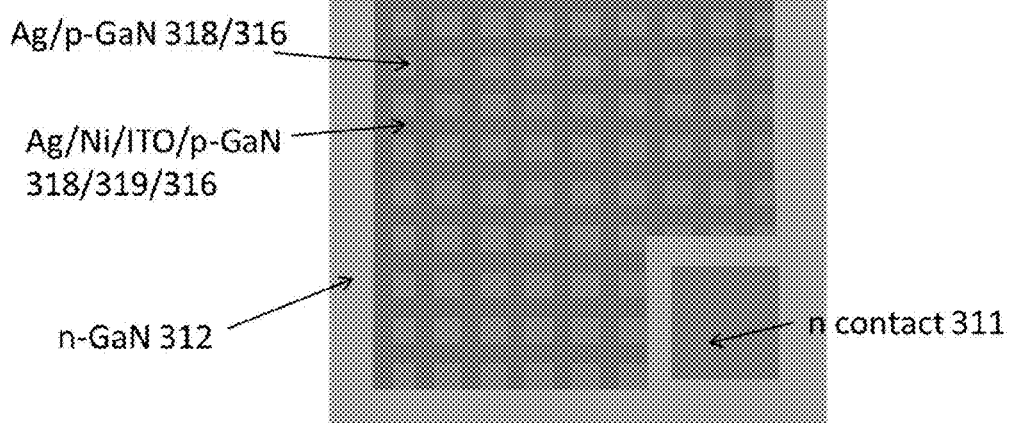

Referring to FIG. 3, the surface plasmon coupled LED 100 of FIG. 1 in accordance with the present embodiment is depicted. FIG. 3A comprises a perspective three-dimensional view, FIG. 3B comprises a cross sectional view, and FIG. 3C comprises a top planar view. From bottom to top, the LED 300 comprises a sapphire substrate 310, a n-GaN layer 312, a QW layer (InGaN) 314, a p-GaN layer 316, a current spreading layer or an electrode layer (Ni/ITO) 319 on certain regions of the p-GaN layer and a Ag layer 318, as well as a n-contact 311 forming a first electrode fabricated on a top surface of the n-GaN layer 312. The electrode layer forms a second electrode. The p-GaN layer 316 is thin down using conventional photolithography and inductive plasma etching (ICP), so that selectively etched regions is close enough to the InGaN layer 314 for QW-SP coupling. Other regions may still maintain good ohmic contact needed for the formation of a p-n junction in the LED. Both optical and electrical characterization (will be discussed below) shows that there is a dramatic increase in the modulation speed of the LED. Since this design is based on standard LED materials and conventional LED processing steps, it is easier to be integrated into existing LED manufacturing lines.

Figure 4:
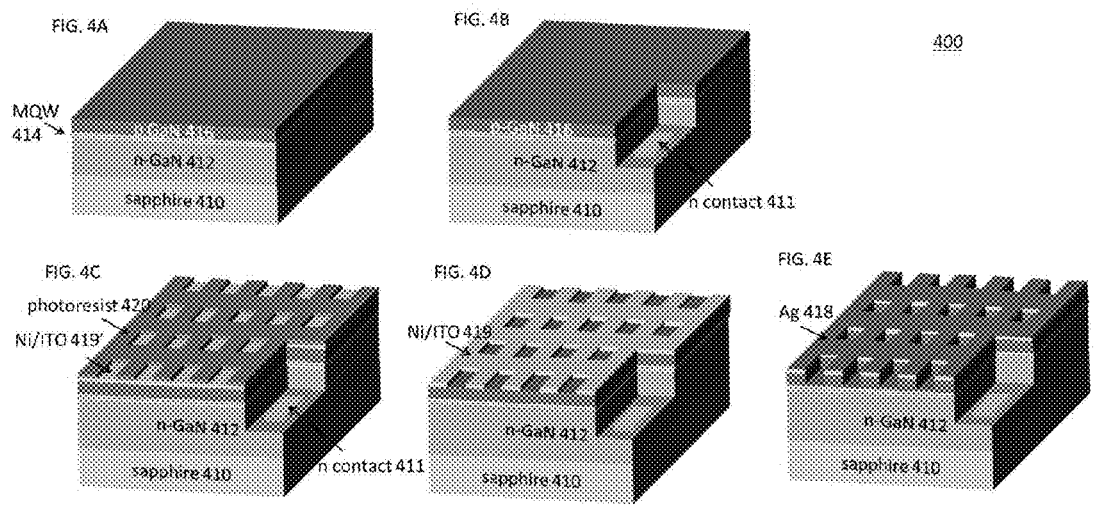
FIG. 4, comprising

Referring to FIG. 4, steps of a LED fabrication process in accordance with the present embodiment for an LED device with light emission from a polished sapphire substrate outer surface thereof are discussed. That is, the light emission of the LED is extracted from the rear side of the LED. A conventional blue textured LED wafer, comprising a sapphire substrate 410, a n-GaN layer 412, a multiple QW (MQW) layer 414 and a p-GaN layer 416, is chosen as a starting material as shown in FIG. 4A. The sapphire substrate 410 has been polished to reduce the light scattering from the rear end of the LED.

In FIG. 4B, a n-contact or an electrode pad 411 is fabricated onto the LED by the following process: i) a portion of the n-GaN layer 412 is exposed by photolithography and inductively coupled plasma etching to a depth of 1 μm using $BCl_3$ (20 sccm) and $Cl_2$ (10 sccm) for 360 s at 10 mTorr pressure; and ii) a n-contact pad is created using Ti (5 nm)/Al (200 nm)/Ti (10 nm)/Au (100 nm) by electron beam evaporation followed by rapid thermal annealing. The electrode pad forms a first electrode.

Following the process of FIG. 4B, an electrode layer 419' using Ni (10 nm)/ITO (200 nm) is fabricated on top of the LED wafer as a current spreading layer as shown in FIG. 4C. Photolithography is used to define lines of 2.5 μm horizontally and vertically across the electrode area of the LED. After that, the LED is submerged in $HCl:H_2O$ (1:1) for 10 s to remove the uncovered ITO and Ni layer by the photoresist. A Ni/ITO pattern 419 is left behind as the electrode layer once the photoresist is removed in acetone as shown in FIG. 4D. The electrode layer forms a second electrode.

Using the Ni/ITO pattern 419 as a mask, ICP is used to etch the uncovered p-GaN layer to less than 20 nm thick as shown in FIG. 4E. Finally, a layer 418 of $MgF_2$ (10 nm)/Ag (30 nm) is deposited over the electrode layer 419 and the etched surface of p-GaN layer.

In the LED fabricated in the above process as shown in FIG. 4A-E, the QW emission is within the fringing field of the SP (SP) modes at the Ag/GaN interface, which is necessary for strong coupling. Accordingly, a QW-SP coupling is created in the LED.

Figure 5:
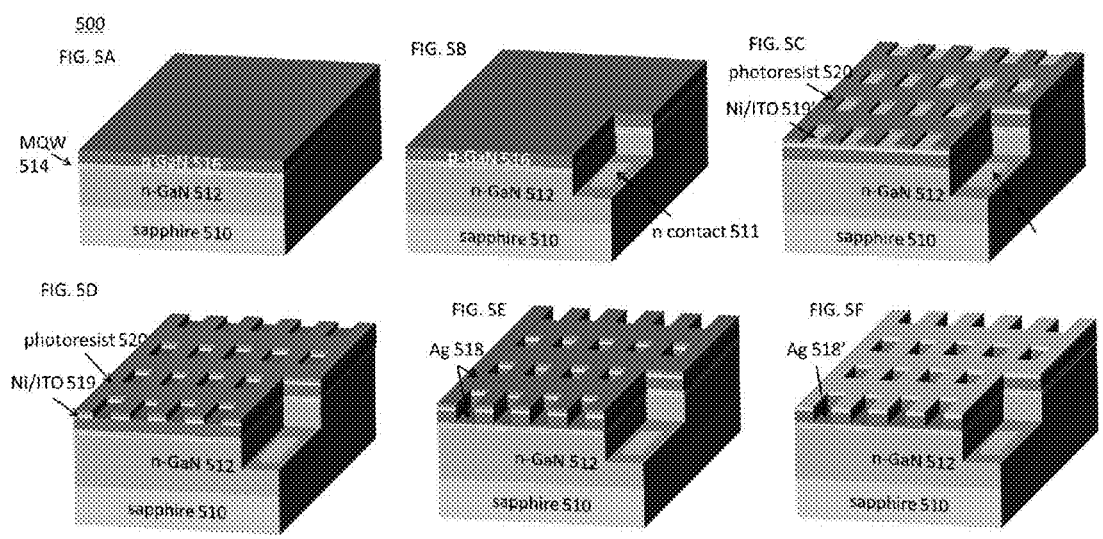
FIG. 5, comprising

Referring to FIG. 5, steps of a LED fabrication process in accordance with the present embodiment for an LED device with light emission from a top surface opposite a substrate bottom surface thereof are discussed. That is, the light emission of the LED is extracted from the top side of the LED. FIG. 5A-C shows the same processes as in FIG. 4A-C. However, in FIG. 5D, the photoresist 520 is not removed and remained on the Ni/ITO pattern 519. In FIG. 5E, the p-GaN layer is etched as described with regards to FIG. 4E and an Ag layer 518 is deposited over the remained photoresist and the etched surface of the p-GaN layer. Furthermore, in FIG. 5F, the Ag layer deposited on the photoresist is lift-off by removing the photoresist. Therefore, the Ag layer 518' is partially covered on the etched surface of the p-GaN layer of the LED. The QW emission in the LED as fabricated herein is within the fringing field of the SP modes at the Ag/GaN interface. Accordingly, a QW-SP coupling is created in the LED.

Figure 6:
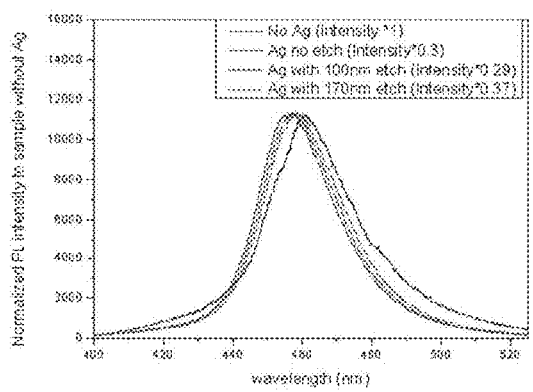
FIG. 6, comprising
Figure 6:
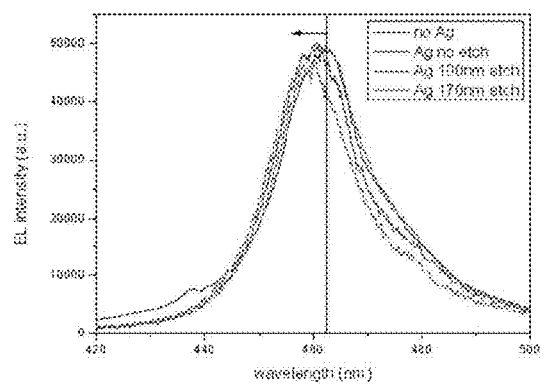
Figure 6:
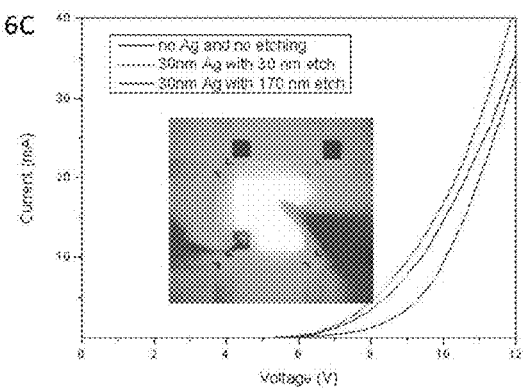
Figure 6:
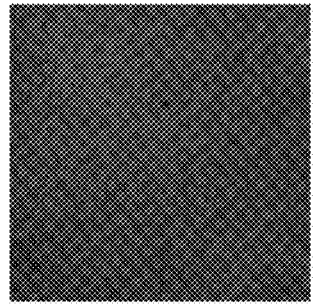

Referring to FIG. 6, graphs of luminescence properties of the LED of FIG. 1 in accordance with the present embodiment are plotted. FIG. 6A depicts a graph of photoluminescence intensity of LEDs collected through the substrate of the LED in accordance with the present embodiment, FIG. 6B depicts a graph of electroluminescence intensity of LEDs in accordance with the present embodiment, FIG. 6C depicts a graph of IV curves of LEDs in accordance with the present embodiment wherein an insert depicts an electroluminescence image of an LED emitting from the top surface in accordance with the present embodiment, and FIG. 6D depicts a magnified view of an electroluminescence image of the LED emitting from the top surface in accordance with the present embodiment. Measurements have been done for LED device samples without Ag deposition, with Ag deposition but without etching the p-GaN layer, with Ag deposition and with 100 nm etching in the p-GaN layer, and with Ag deposition and with 170 nm etching in the p-GaN layer. It can be seen in FIG. 6A that the PL intensity spectra is about 3-4 times brighter after Ag deposition, mostly due to the metal reflection. A blue shift of ~5 nm in the PL peak position from 461 nm to 456 nm can be seen after etching and Ag deposition. This may be due to QW-SP coupling of the LED as etching does not have any effect on the peak position (data not shown). The EL intensity spectra (FIG. 6B) collected at a constant current of 0.8 mA is rather similar to the PL spectra in FIG. 6A. A similar EL blue shift can be seen for the LED sample with etching and Ag deposition. As seen in FIG. 6C, there is no change in the threshold voltage (~6V) for the samples before and after Ag deposition. However, prolonged etching will lower the injection current and increase the resistance for the same voltage applied. The inset in FIG. 6C shows the EL image from the top surface of the LED. Light can be extracted from the front side of the LED, if the p-GaN layer is textured and the Ag layer is thin enough for light transmission. In FIG. 6D, stronger emission can be seen from the etched regions and their edges as compared to the surrounding. This could be due to SP enhanced brightness as the SPP generated are re-radiated out of the patterned and textured surface of the p-GaN layer.

Figure 7:
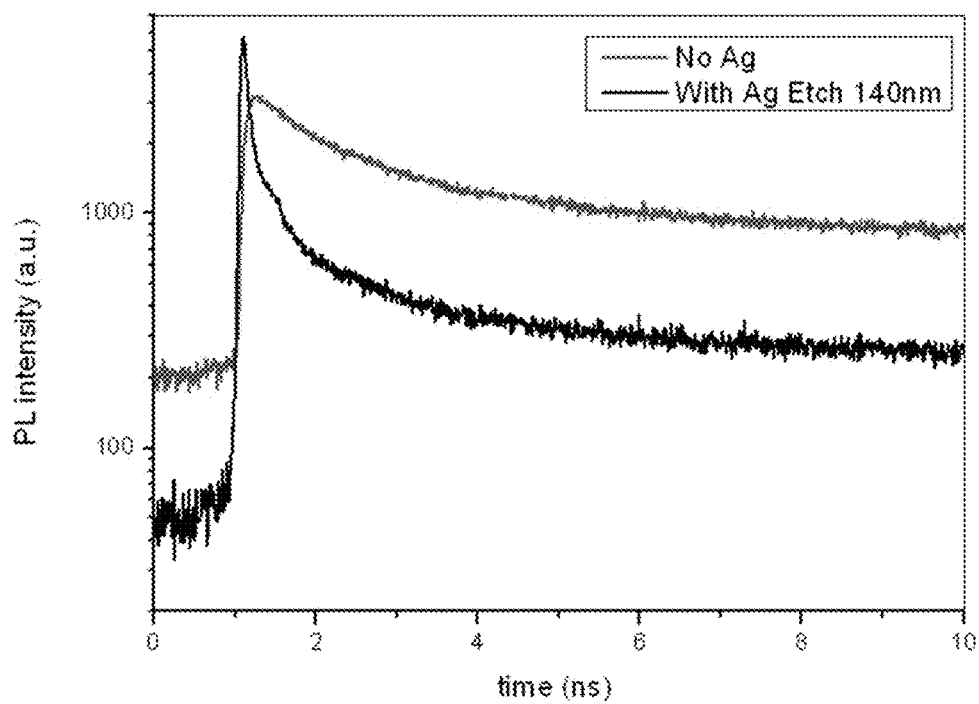
FIG. 7 depicts a graph of time resolved photoluminescence before Ag deposition and after Ag deposition with etching in accordance with the present embodiment.

Referring FIG. 7, a graph of time resolved photoluminescence before Ag deposition and after Ag deposition with etching in accordance with the present embodiment is plotted. Time resolved photoluminescence (TRPL) is carried out using a pulsed 405 nm solid state diode laser operating at a repetition rate of 2.5 MHz (PicoQuant, PDL800-B). It is a measure of how fast the emission decay after being excited by a single pulse of light. Excitation and detection of light is obtained from the backside of LED. The photoluminescence emission is then focused using a couple of lenses into a monochromator (Acton, SpectroPro 2300i) and then recorded using a time correlated single photon counter (TCSPC) setup {PicoQuant, Picoharp 300). FIG. 7 shows the TRPL of a blue LED at 460 nm wavelength with the same collection time. Without Ag deposition, the time constant is 1.67 ns. Results are similar for the sample without Ag but with etching, indicating that etching does not affect the radiative decay rate. With p-GaN etching and Ag deposition, it can be seen a sharp decrease in the radiative decay rate. In fact, there are two time constants for the sample with Ag deposition and etching: the fast decay of 100 ps due to the SP coupling, while the slow decay of 1.7 ns due to the spontaneous emission to free photons. Both mechanisms will compete for recombination and the probability of decaying into SPP or photons is indicated by its relative PL intensity. It can be seen that for the sample with Ag deposition and etching, the PL emission due to SP coupling is much stronger than that of free photon emission, suggesting efficient QW-SP coupling.

Figure 8:
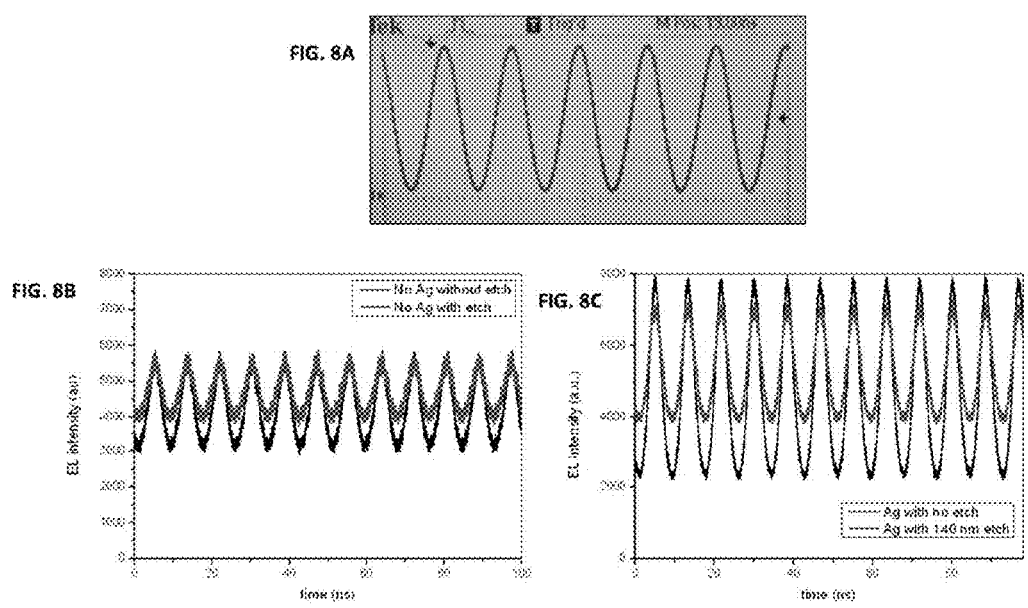
FIG. 8, comprising
Figure 9:
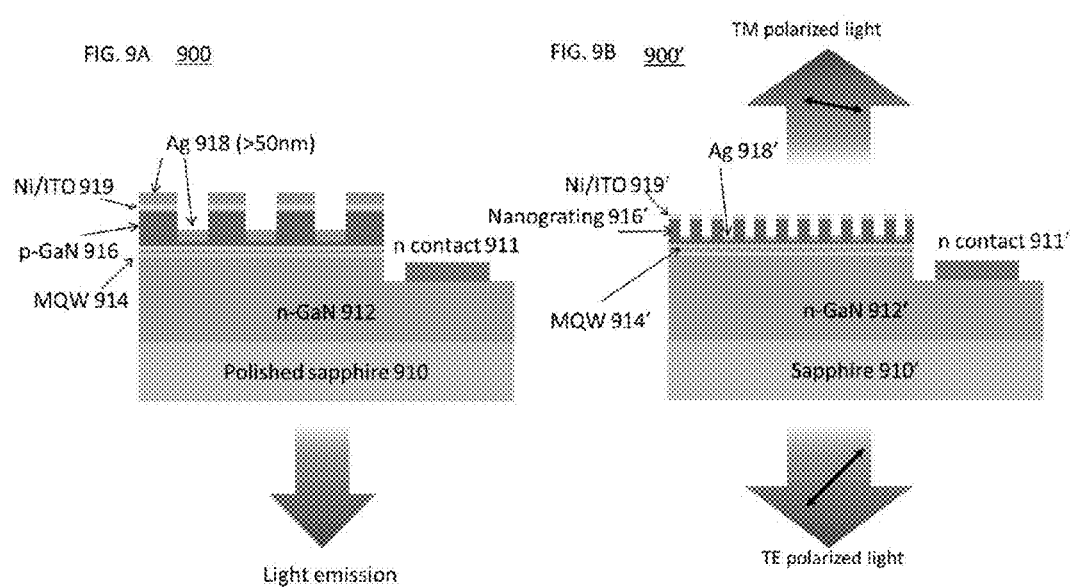
FIG. 9A depicts a cross-section view of a LED with a thick Ag film as a reflector for a rear end of the LED in accordance with an alternate embodiment.
FIG. 9B depicts a cross-section view of the LED with sub-wavelength grating for obtaining polarized light from either a front end or a rear end of the LED in accordance with another alternate embodiment.

Referring to FIG. 8, the speed of modulation of the LED device is tested using electrical pulses of 0-7 V, switching at a frequency of 120 MHz. The pulse width is 3 ns and fall time is 2 ns, resulting in a sinusoidal pulse train. FIG. 8A depicts a graph of a LED driving signal. This driving signal is synchronized with the detection signal using a triggering output. Output electroluminescence signals from an LED in before Ag deposition and after Ag deposition are shown in FIG. 8B and FIG. 8C, respectively. Before Ag deposition, the LED samples show shallow modulation depth of –25% in FIG. 8B. Etching does not seem to have much effect on the modulation depth as it increases slightly to 33%. After Ag deposition on the LED device, the modulation depth increases to 42% as seen in FIG. 8C; this is further improved to 72% if the LED is subjected to selective etching of p-GaN. In other words, the LED speed can be significantly improved to higher than 120 MHz due to enhanced QW-SP coupling. Electrically excitation of the surface plasmons through QW emission may enable production of high speed LED with a significantly enhanced spontaneous emission rate. This technology can lead to low cost mass production of high modulation speed LED that has potential for immediate impact to the solid state lighting and communication industry.

Referring to FIG. 9A, a cross-section view of a LED 900 with a thick Ag film as a reflector for a rear end of the LED in accordance with an alternate embodiment is shown. By depositing a thick enough Ag layer of more than 50 nm, it is possible to use it to reflect almost 100% of the light from the top, as shown in FIG. 9A. It can also be called flip-chip. Light may be emitted from the rear end of the LED if the metal layer has a thickness of more than 30 nm. Light may be emitted from both the front and rear ends of the LED if the metal layer has a thickness of less than 30 nm. Referring to FIG. 9B, a cross-section view of the LED with subwavelength grating for obtaining polarized light from either a front end or a rear end of the LED in accordance with another alternate embodiment is shown. The QW emission from LED is not limited to excitation of SP in Ag films. Localized surface plasmons may be electrically excited by using plasmonic/metamaterial nanostructures. Various examples in this regard are disclosed below. Often, metallic nanoantennas, nanoparticles and apertures can be engineered for different functionalities, such as filtering, polarization control, enhanced optical transmission, colour tuning, beam shaping, collimation and steering. By incorporating these nanostructures on top of LED, other light emitting properties of the LED can be engineered for particular applications. For example, by patterning subwavelength grating on top of the LED (FIG. 9B), it is possible to obtain highly polarized as well as fast spontaneous emission from the LED. In this case, the light from LED can be either from the front or rear substrate.

Figure 10:
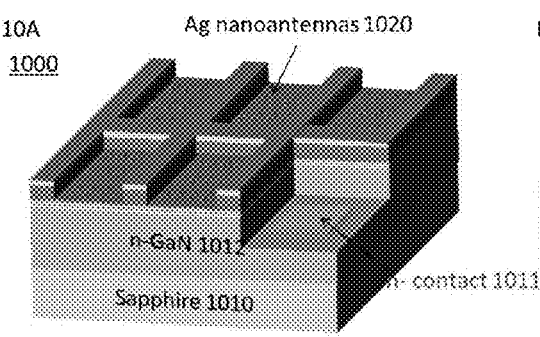
FIG. 10, comprising
Figure 10:
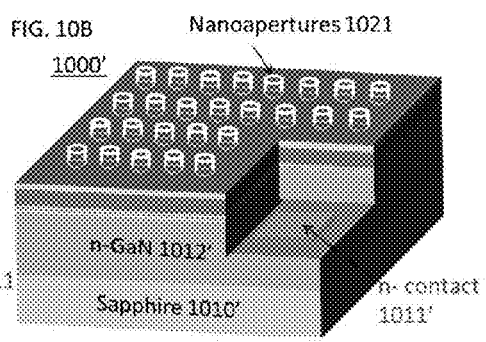
Figure 10:
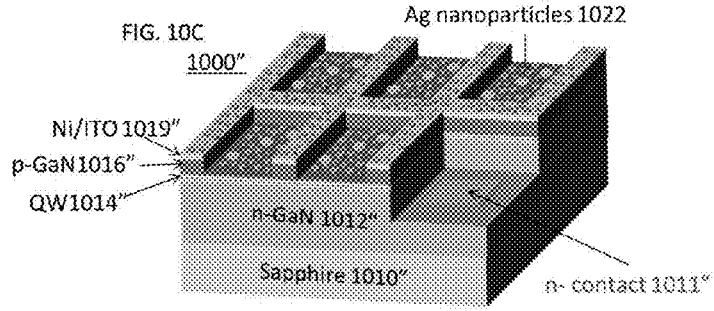

Referring to FIG. 10, perspective three-dimensional illustrations of LEDs 1000, 1000', and 1000" in accordance with an alternate embodiment including various enhancements are shown. FIG. 10A depicts a LED structure including nanoantennas 1020, FIG. 10B depicts a LED structure including nanoapertures 1021, and FIG. 10C depicts a LED structure including nanoparticles 1022. FIG. 10A shows that nanoantennas can be formed after selective etching of the p-GaN using electron beam lithography and Ag deposition. In FIG. 10B, focused ion beam writing can be used to directly pattern nanostructures, for example, nanoapertures, into a LED device before Ag deposition. It is also possible to use electron beam lithography and ICP to create nanoapertures prior to Ag deposition. Instead of using nanopatterning technique, another approach is to deposit a layer of Ag on top and to perform annealing to obtain random array of Ag nanoparticles, as seen in FIG. 10C. This device is easy to fabricate but has less control than FIGS. 10A and B.

Figure 11:
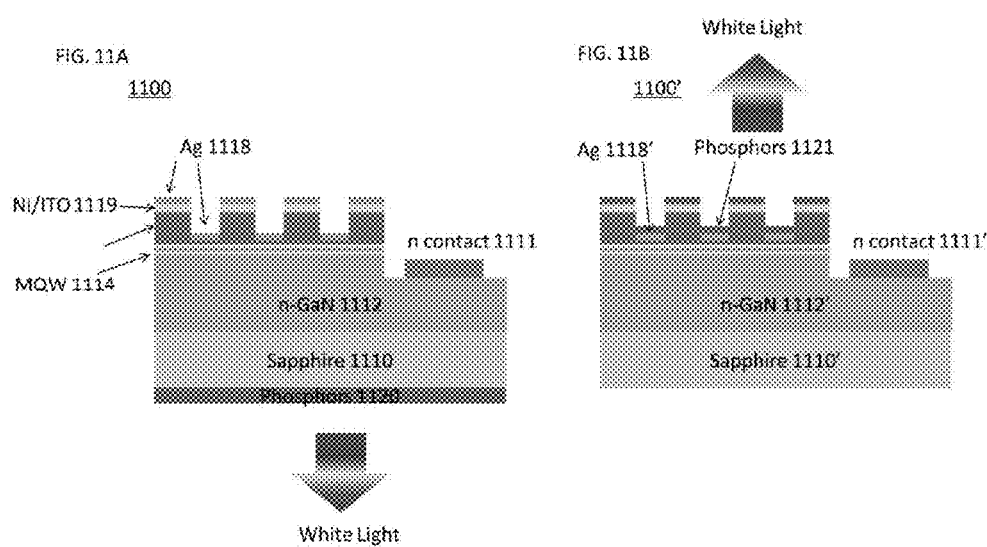
FIG. 11, including

Referred to FIG. 11, a LED in accordance with the present embodiment having an emitting surface covered in phosphors. FIG. 11A depicts a LED 1100 having an emitting rear surface covered by phosphors 1120 and FIG. 11B depicts a LED 1100' having an emitting front surface covered by phosphors 1121. White light can be extracted from the LED device by depositing a layer of phosphors on top of the LED, which may be more useful for free space communications. White light may be emitted from the front end of the LED if a phosphors layer is deposited on the front end of the LED while the metal layer is deposited on the etched surface of the p-GaN layer but not on the non-etched surface. White light may be emitted from the rear end of the LED if a phosphors layer is deposited on the rear end of the LED while the metal layer is deposited on both the etched surface and the non-etched surface of the p-GaN layer. Through QW-SP coupling, different wavelengths from red to near IR may be emitted by incorporating different materials, such as GaAs/AlGaAs, GaInP/AlGaInP, InGaAs/GaAs, InGaAlP/InP, InGaAsP/InP, etc, into a LED.

Figure 12:
FIG. 12 depicts a diagram of a correspondence between different materials and their respective emitting wavelengths.

Referring to FIG. 12, a correspondence between different materials and their respective emitting wavelengths is depicted. This would be very useful for open space communication in defense and security.

In the above example, QW-SP coupling is mainly created by selectively etching the p-GaN layer of a conventional LED to avoid using ultrathin p-GaN layer. Etched regions of the p-GaN layer are in close proximity to the QW for resonant SP coupling while other regions maintain good ohmic contact.

In the following example, QW-SP coupling is created by depositing a textured p-GaN layer with random distribution of hexagonal V-pits. By depositing a 50 nm thick metal film on top of a textured LED, significant enhancement in Purcell factor can be obtained. The Purcell factor is the emission rate enhancement of a spontaneous emitter inside a cavity or resonator. Texturing of the LED is shown to help significantly enhance the coupling length. No etching of p-GaN or additional post-processing is needed that can compromises the efficiency of the LED device.

Figure 13:
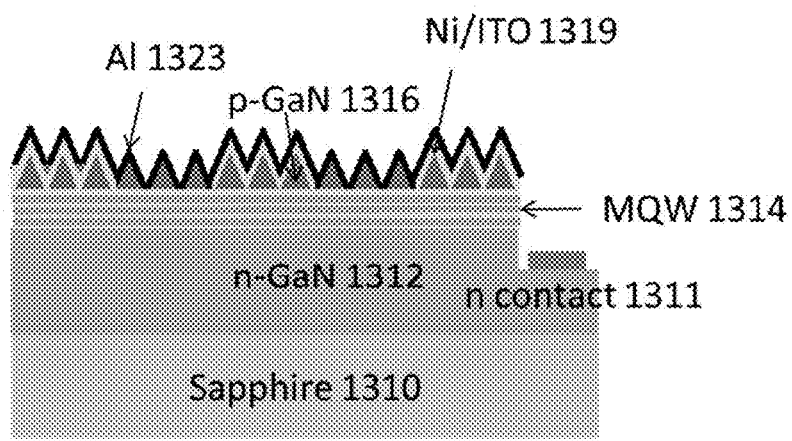
FIG. 13, comprising
Figure 13:
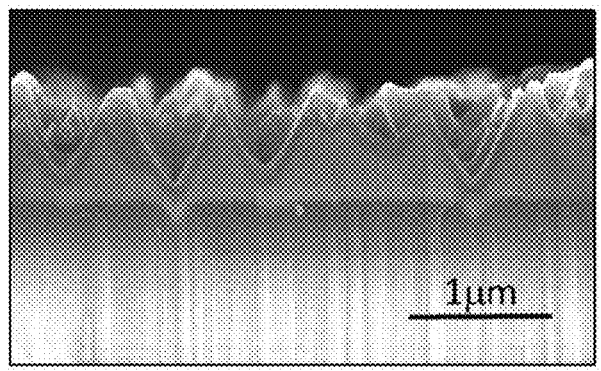
Figure 13:
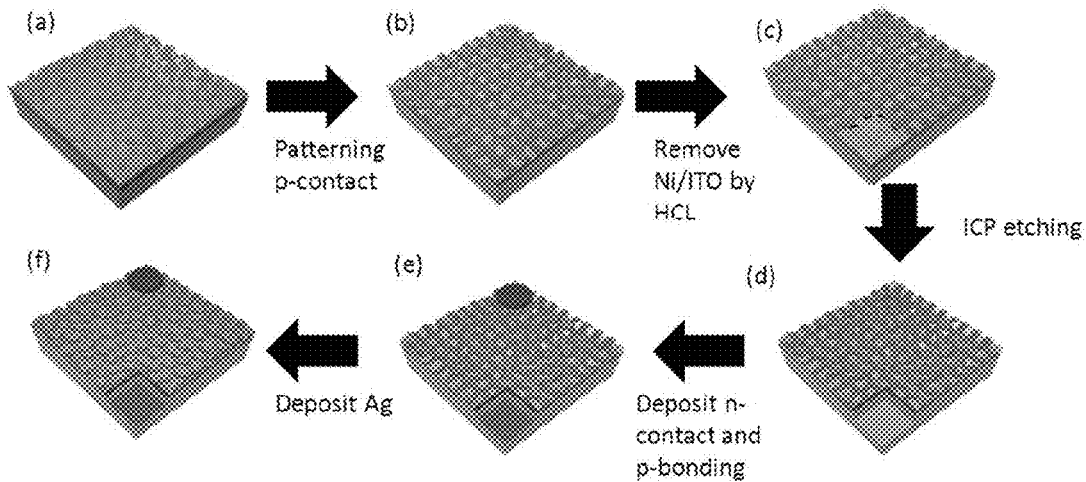

Referring to FIG. 13, a surface plasmon coupled LED 1300 with p-GaN texturing in accordance with the present embodiment is depicted. FIG. 13A depicts a three-dimensional perspective view, FIG. 13B depicts a cross-sectional SEM view of the textured p-GaN layer, and FIG. 13C depicts a six-step fabrication process for fabricating the p-GaN textured LED. An electrode layer 1319 is deposited on selective portions of the p-GaN layer and the metal layer (Al) 1323 is deposited on both the electrode layer 1319 and the other portions of the p-GaN layer, the other portions being different from the selective portions of the p-GaN layer. The surface plasmon metal can be formed on textured p-GaN surface of the LED device. By texturing the p-GaN surface, the surface plasmon (SP) generated at the metal/GaN interface can out-couple to free space photon before it gets dissipated as heat, thus improving light extraction from the device. It can be seen that the distance from p-GaN to QW is about 20-170 nm at the V-groove. The V grooves also helps to increase the coupling length and strength between SP and QW emission at the closet point.

In accordance with the present embodiment, a method for fabricating a light emitting diode (LED) is provided. The method comprises depositing a first-doped GaN layer with first impurities on a substrate, forming one or more quantum well layers on the first-doped layer, depositing a second-doped GaN layer with second impurities on the quantum well layer, and depositing a metal layer over the second-doped layer. Depositing the second-doped GaN layer comprises depositing a first portion of the second-doped GaN layer to have a first thickness and a second portion of the second-doped GaN layer to have a second thickness, the first thickness being defined as a surface plasmon thickness that cause electron-hole pairs in the one or more quantum well layers to couple efficiently to a surface plasmon mode at an interface of the metal layer and the second-doped layer for an increased spontaneous emission rate of the LED and the second thickness being determined to ensure the formation of a p-n junction in the LED.

The method may further comprise forming an electrode pad being a first electrode in contact with the first-doped GaN layer and the electrode layer forming a second electrode in contact with the second-doped GaN layer.

Depositing the second doped GaN layer may comprise texturing a plurality of sharp V-pits so that the thinnest portion of the second-doped layer and the metal layer over the thinnest portion both are within the surface plasmon coupling thickness.

Depositing the metal layer over the second-doped layer may comprise depositing the metal layer over the electrode layer.

Depositing the metal layer over the second-doped layer may comprise avoiding the second-doped layer where the electrode layer is formed.

Depositing the metal layer over the second-doped layer comprises depositing over the first portion of the second-doped layer but not over the second portions of the second doped layer. This is done by avoiding the second portions of the second doped layer when depositing the metal layer over the second-doped layer.

Figure 14:
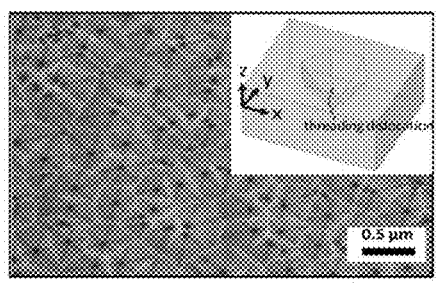
FIG. 14, comprising
Figure 14:
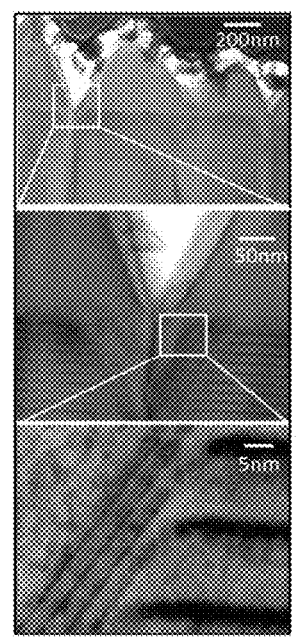
Figure 14:
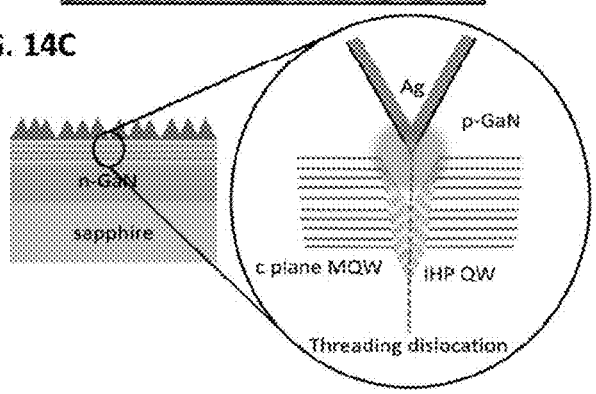

Referring to FIG. 14, further views of a surface plasmon coupled LED with p-GaN texturing in accordance with the present embodiment are depicted. An InGaN blue LED sample used was grown by MOCVD on a sapphire substrate. Trimethylgallium (TMGa), trimethylindium (TMIn), trimethylaluminium and ammonia were used as Ga, In, Al and N sources. The LED structure ($\lambda$=460 nm) includes a 1 µm thick Si doped GaN, 10 pairs InGaN (3 nm)/GaN (12 nm) multiple QW (MQW), and a 40 nm thick Mg doped AlGaN layer and a 600 nm thick Mg-doped GaN layer. By increasing the flow rate of TMGa during p-AlGaN growth, it is possible to obtain a roughened textured p-GaN resembling that shown in FIG. 14A. Random distribution of hexagonal V-pits can be seen from the top surface. Cross-sectional transmission electron microscopy (FIG. 14B) shows a total of 10 pairs of MQW with narrower QWs of InGaN(0.75 nm)/GaN (3 nm) formed in the inverted V-pits. Due to the large intrinsic piezoelectric fields along the growth direction, V-pits are formed with threading dislocations running down the centre of the V-pits. The thinner QW acts as a high potential barrier to shield carriers from non-radiative recombination at the threading dislocations (TDs), resulting in large efficiency despite high density of TDs. At the closest point, the V-pits can get as close as 20 nm from the InGaN layer.

The effect of texturing on the surface plasmon coupling distance and strength is disclosed below. Also, the effect of different metals and gaps on the carrier dynamics and internal quantum efficiency (IQE) of such an LED is disclosed. Results are compared with simulated results using Lumerical finite difference time domain (FDTD).

Referred to FIG. 15A, a schematic diagram of a time resolved photoluminescence emitting setup and a graph of a normalized PL spectrum are depicted. Time resolved photoluminescence (TRPL) was carried out using a pulsed laser at 405 nm wavelength with a pulse width 50 ps and repetition rate of 2.5 MHz generated by a PicoQuant PDL-800B pulsed diode driver. The laser light, after passing through a set of lenses, is focused onto the LED sample. Excitation and collection of the LED is performed through the polished backside of the sapphire. Optical emission is collected into a monochromator (SP-2300i Princeton Instruments) with two ports: one connected to a CCD camera and the other connected to a Hamamatsu Multichannel Plate-Photomultiplier tube (MCP-PMT). A mirror is used to switch between the 2 ports for spectrograph and TRPL separately. A PicoHarp 300, time correlated single photon counter is used to synchronize the input and amplified signal output from the MCP-PMT. It counts the number of photons being detected at a particular time from the start of excitation with a temporal resolution of 8 ps. The decay time is extracted by fitting an exponential decay curve. Temperature dependence PL measurements are carried out using a helium compressor with the ability to cool down from room temperature to 10K.

Figure 15:
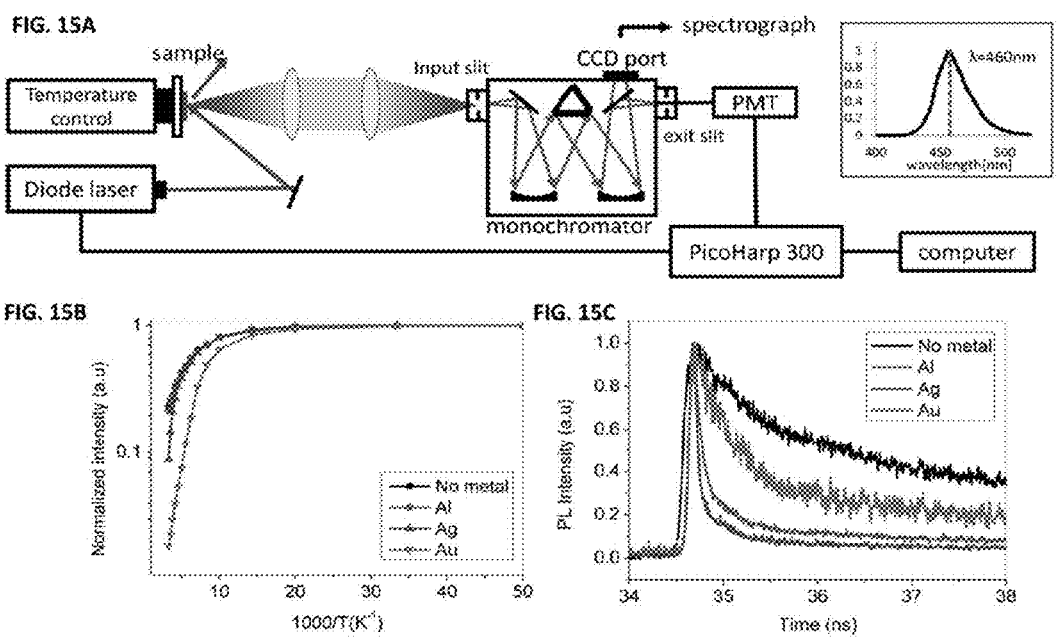
FIG. 15, comprising

Up to date, Ag has been the most studied due to the overlap in surface plasmon resonance energy with InGaN emitter and the relatively lower loss at visible wavelength. The effect of Al, Ag and Au on the emission properties and carrier dynamics of the textured V-pit LED is disclosed herein. FIG. 15B depicts Arrhenius plots of integrated PL intensity for coated and non-coated LEDs, and FIG. 15C depicts corresponding TRPL data of the LED as depicted in FIG. 15B at room temperature. After metal deposition, it can be seen in FIGS. 15B and 15C that both the PL intensity and time decay has been reduced. This indicates the strong SP-QW coupling as PL intensity is absorbed by metal rather than being emitted radiatively. By performing low temperature PL, the IQE is determined, assuming that $\eta_{int}(10K)$= 100%. The IQE for an uncoated LED sample is 22%. It is reduced to $\eta_{int}$=8.8% for Ag and 1.8% for Au. It remains relatively unchanged for Al at 20%. The time decay is measured at the quantum well peak wavelength of 460 nm. In terms of time decay constants, it can be seen that Ag produces the fastest decay, followed by Al. Au gives the slowest decay constant. Table 1 shows a summary of the results obtained in FIG. 15. It has been shown that the properties of metal play an important role in determining the IQE and time constants. Au has the poorest performance in terms of both parameters. Although Ag shows the fastest decay, it causes IQE to drop to 8.8%. Al shows considerable enhancement in time constants while still maintaining the original IQE, making it desirable for plasmonic applications in the blue region. Even though the resonance energy of Al of 261 nm does not matched closely to the QW emission, there is still significant overlap between the SP energy and QW emission at 460 nm wavelength for enhancement in Purcell factor to be obtained. This offers an effective and simple method of converting a conventional LED into ultrafast LED.

Figure 16:
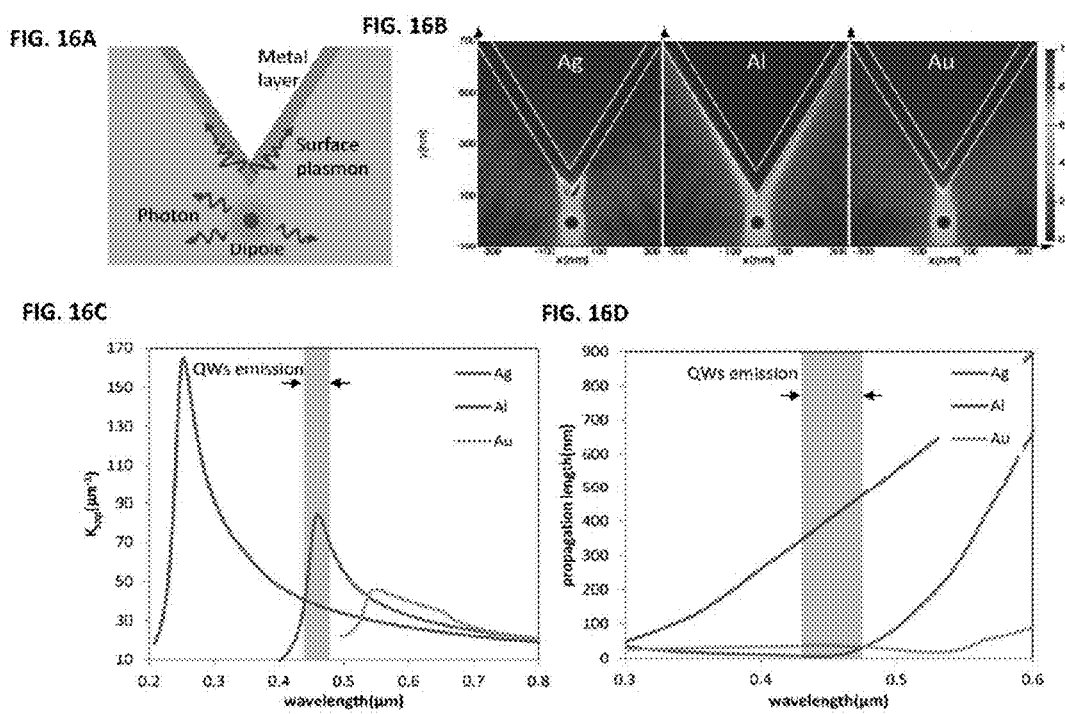
FIG. 16, comprising

Referring to FIG. 16, operational features of the LED in accordance with the present embodiment are considered. FIG. 16A depicts a schematic diagram of dipole interaction with a metal layer, FIG. 16B depicts electric field distribution images of SP modes excited by the dipole interaction, FIG. 16C depicts a graph of dispersion relation of the metal/GaN interface, and FIG. 16D depicts a graph of propagation length of SP in Ag, Al and Au coated LED, in accordance with an embodiment. The fringing field z and propagation length L can be written as $$Z = \frac{\lambda}{2\pi}\left[\frac{\varepsilon'_{GaN} - \varepsilon'_{metal}}{(\varepsilon'_{metal})^2}\right]^{1/2}$$

and $$L = \left[2\,\text{Im}\left(\frac{2\pi}{\lambda}\sqrt{\frac{\varepsilon_{GaN}\varepsilon_{metal}}{\varepsilon_{GaN} + \varepsilon_{metal}}}\right)\right]^{-1}$$

respectively. Here $\varepsilon'_{GaN}+i\varepsilon''_{GaN}$ and $\varepsilon_{metal}=\varepsilon'_{metal}+i\varepsilon''_{metal}$ are the dielectric constants for GaN and metal. The fringing field, z, dispersion relation, $k_{spp}$, and propagation length, L, of different metals are discussed below. With reference to FIG. 16B, when SP energy of Ag coincides with the QW emission, strong resonant absorption and coupling to the metal surface can be seen. SP mode appears highly localized at the V-pit and has a very short propagation length. If the SP energy can emit out radiatively, an increase in light output will be observed. However, the reduced in IQE shows that most of the SP energy is absorbed by the metal or TDs. With reference to FIG. 16C, when the QW emission falls outside of the SP resonance energy, SP coupling and absorption by Al is about half that of Ag. The SP mode is extended along the metal/GaN interface and less localized at the V-pit. SP energy has higher probability of recombining radiatively rather than absorbed by the metal and TDs. Due to the lower absorption, much higher propagation length for Al is seen in FIG. 16D. The fringing field of Al deposition is the highest too amongst all three metals. Au shows the poorest coupling and absorption compared to Ag and Al. Table 1 shows a summary of the various parameters associated with uncoated LED and Ag, Al and Au coated textured LED.

TABLE 1

Summary of time decay constants, IQE, FOM and fringing field for Ag, Al and Au on LED as compared to when no metal is used.

| Material | Time decay (ns) | IQE (%) | Propagation length(nm) | Fringing field (nm) |
|---|---|---|---|---|
| No metal | 1.16 | 22.9 | — | — |
| Al | 0.085 | 20.4 | 433 | 70 |
| Ag | 0.060 | 8.8 | 12 | 43 |
| Au | 0.45 | 1.8 | 35 | 33 |

Figure 17:
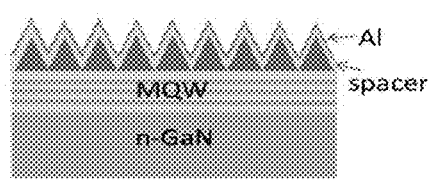
FIG. 17, comprising
Figure 17:
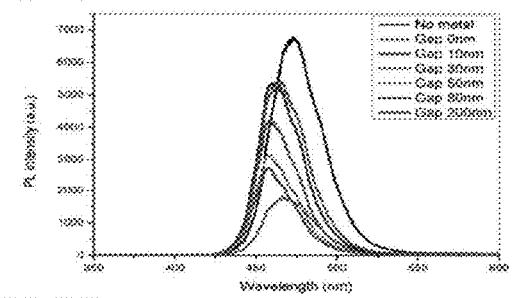
Figure 17:
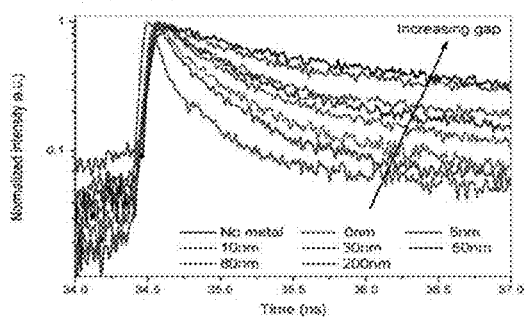
Figure 17:
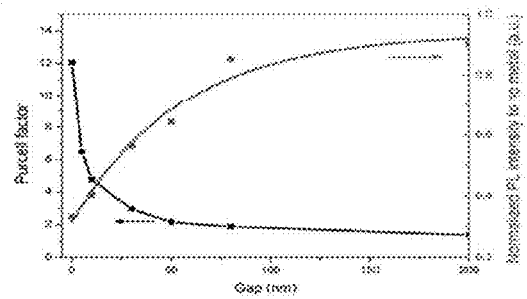

The effect of gap on the TRPL and PL intensity of Al coated LED is discussed with reference to FIG. 17. FIG. 17A depicts a cross-sectional view of a LED 1700 having the AL coated texture and FIGS. 17B, 17C and 17D depict graphs of PL, normalized PL and Purcell effect of the Al coated textured LED of FIG. 17A. After Al deposition, significant quenching of the PL intensity and decrease in time decay are seen in FIGS. 17B and 17C, indicating the strong SP-QW coupling. This is remarkable considering the fact that only a small density of tips is in close proximity to the QW. FIG. 17D shows a trend of the change in Purcell effect and PL intensity with gap. As the gap increases, the SP-QW coupling reduces and intensity starts to increase and approaches that of the original intensity without metal. From the TRPL measurements, the Purcell factor decreases rapidly with gap. At a gap of 200 nm, it can be seen that the time decay rate returns to the original value. This is almost 4 times longer than the coupling length on a flat surface. It can be seen that by simply depositing an Al layer on it, the time decay can be increased by 12 times accompanied by 70% reduction in PL intensity. Since $\eta_{SP}$ is unchanged, the lower PL intensity is due to the poor extraction efficiency from the LED. This depends strongly on the metal morphology. The random nature of the inverted hexagonal pits (IHPs) and the deep V-pits means that the design is not optimal for radiative emission of SP. It has been shown that careful design of gratings can increase the intensity by 10 times.

Figure 18:
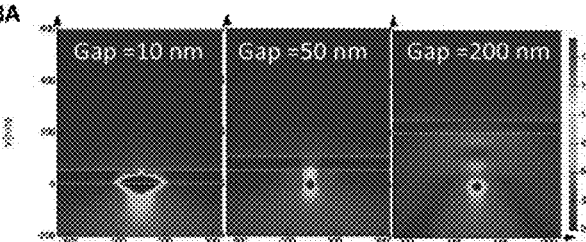
FIG. 18, comprising
Figure 18:
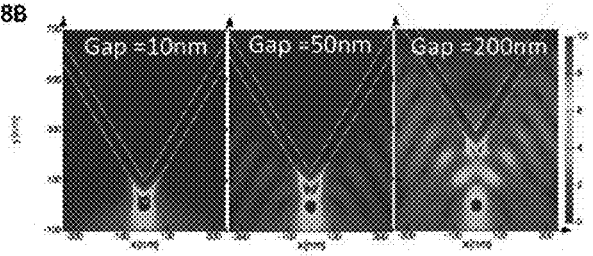
Figure 18:
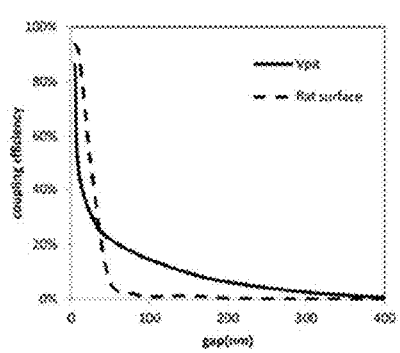

Referring to FIG. 18, simulations and a graph of features of the LED in accordance with the present embodiment having various surfaces are depicted. FIGS. 18A and 18B depict simulations of dipole-SP coupling on a flat surface (FIG. 18A) and a V-pit surface (FIG. 18B), and FIG. 18C depicts a graph of the coupling efficiency with V-pit gap. Both Ag- and Al-deposition show similar behavior. Time average electric field distribution of the SP on Ag/GaN is shown in FIGS. 18A and B. SP coupling is more visible due to highly localized SP mode. FIG. 18C shows the coupling efficiency on V-pits and flat surface. The coupling efficiency is determined by the fraction of energy confined at the metal interface=1-fraction of scattered light. On a flat surface, dipole can couple into the SPP when it is within the fringing field of the mode. This can be seen at close proximity and becomes very weak at a distance of 50 nm. On the V-pit surface, strong SP coupling within fringing field is seen. Even outside the fringing field of 40 nm, significant coupling efficiency still occurs, indicating the enhanced coupling distance due to the V-pit. By averaging the dipole energy in x and y polarization, the coupling efficiency is plotted as a function of gap for Ag and Al. Al shows stronger coupling at larger distance due to the longer fringing field. Although the large SP density of states is important for increasing the spontaneous emission rate, fringing field also plays an important role in improving the SP coupling at greater distance. As seen from TEM images FIG. 14B, the minimum gap is about 20 nm. Al is able to produce larger enhancement at greater distance, resulting an average Purcell factor that is comparable with Ag. Combined with texturing of surface with V-pits, the coupling distance can be significantly improved from 40 nm to 200 nm, relaxing the stringent requirement of implementing SP coupling in a LED device.

The IQE of plasmonic LED can be written as follows $$\eta_{int}^{sp} = \frac{R_r + R_{sp} \times c}{R_r + R_{sp} + R_{nr}} = \frac{1 + c\frac{R_{sp}}{R_r}}{1 + \frac{R_{nr}}{R_r} + \frac{R_{sp}}{R_r}}$$

$R_{nr}$ Non-radiative recombination rate to phonons,
$R_r$ Radiative recombination rate to photons $R_{SP}$ Recombination to surface plasmons,
c Probability of radiative recombination from SP energy.
The Purcell factor of the plasmonic LED, Fp, can be written as $$Fp = \frac{R_r + R_{nr} + R_{sp}}{R_r + R_{nr}} = \frac{1 + \frac{R_{nr}}{R_r} + \frac{R_{sp}}{R_r}}{1 + \frac{R_{nr}}{R_r}}$$

As seen from the equation, the IQE for plasmonic LED is not only dependent on $R_{nr}/R_r$, but it also depends on the probability for radiative emission from SP energy, c, and $R_{sp}/R_r$. c depends on the property of the metals such as intraband absorption, surface roughness and metal morphology. $R_{sp}/R_r$ depends on the coupling efficiency of SP to QW which is determined by the fringing field of the material and the phase matching conditions. In strong coupling circumstances where $$\frac{R_{sp}}{R_r} \gg \frac{R_{nr}}{R_r},$$

it can approximate $\eta_{int}^{SP} \approx c$. From the IQE measurements, it means that Al is able to convert about 20% of the SP energy into radiative photons as compared to 9% for Ag and 2% for Au. If one is to look at the plasmonic figure-of-merit (FOM) and fringing field, z, Al gives the highest FOM in the UV-blue wavelength range and longest penetration depth into the GaN. For Al, $\in'_{Al}$ is negative over a wide range of visible wavelengths, resulting in a longer fringing field needed for increasing the SP coupling length. Even though there is much higher density of SP states available for recombination, $\eta_{int}^{SP}$ can still be lower than $\eta_{int}$, if most of the SP energy is not converted to photons. In order for $\eta_{int}^{SP} > \eta_{int}$, c needs to be greater than $\eta_{int}$. This means that it becomes difficult to obtain enhancement of IQE for an efficient light emitter as compared to a poor emitter. It has been shown that SPP enhancement is only useful for inefficient emitter with less than 10% efficiency.

Although depositing a metal film on a flat LED with thin n- or p-doped GaN layer can produce strong SP-QW coupling, the thinly doped layer prevents the formation of an ohmic contact needed for efficient LED operation. Using a LED with textured p-GaN as a platform, this gap is less critical and SP coupling can be observed even outside the fringing field. This implication is significant as it means that strong SP-QW coupling can be achieved without compromising its LED efficiency through additional etching of p-GaN layers. This would be hard to control at nanoscale precision especially on a large scale. The present embodiment shows that Al has the highest probability of converting SP energy into radiative photons compared to Ag and Au, so that its internal quantum efficiency can be preserved. The time decay results are comparable with the fastest decay rates reported previously using other methods used such as photonic crystals, resonant cavity and doping. FIG. 19 shows a cross-section view of 2 other possible designs for surface plasmon coupled textured LED The present embodiment has demonstrated plasmonic LED with strong SP coupling efficiency and longer length needed for integration into a blue GaN led. By simply depositing a layer of Al film on top of a textured LED, a fast decay rate of 85 ps (11 GHz) and an IQE of 20% with a high Purcell factor of 12 have been shown. V-pits are shown to increase the SP coupling length by 5 times, relaxing its stringent requirement for implementation in a LED and any precise etching of p-GaN layer. Al is shown to be the optimal metal for significant enhancement in spontaneous emission without compromising its internal quantum efficiency. This is a simple approach of converting a conventional LED into a high speed LED, which can be adopted by LED companies with immediate impact.

Referring to FIG. 19, the LED depicts the other possible designs for surface plasmon coupled LED with textured p-GaN surface. No selective etching is needed in this case. FIG. 19A shows the LED with metal deposited on the exposed regions of the second doped layer but not over the electrode layer. An electrode layer 1919 is deposited on selective portions of the p-GaN layer and the metal layer (Ag) 1918 is deposited on the other portions of the p-GaN layer, the other portions being different from the selective portions of the p-GaN layer. FIG. 19B shows the LED with metal deposited on the first portions but not over the second portions of the second doped layer. The first portions have a first thickness that cause electron-hole pairs in the one or more quantum well layer to couple efficiently to a surface plasmon mode at an interface of the metal layer and the p-GaN layer for an increased spontaneous emission rate of the LED. The second portion has a second thickness to ensure formation of a p-n junction in the LED. Thus, it can be seen that devices and methods for the QW-SP coupled LED that have been disclosed provide many advantages. In accordance with the present embodiment, an advantageous LED with high modulation speed and high efficiency has been presented which overcomes the drawback of the prior art. In accordance with an embodiment, the fabrication method can be utilized on the conventional LED which is cost-saving and easy-implemented. While several exemplary embodiments have been presented in the foregoing detailed description of the invention, it should be appreciated that a vast number of variations exist, including variations as to the device structure and methods of the fabrication.

It should further be appreciated that the exemplary embodiments are only examples, and are not intended to limit the scope, applicability, dimensions, or configuration of the invention in any way. Rather, the foregoing detailed description will provide those skilled in the art with a convenient road map for implementing an exemplary embodiment of the invention, it being understood that various changes may be made in the systems and methodologies of the exemplary embodiments without departing from the scope of the invention as set forth in the appended claims.

What is claimed is:

1. A light emitting diode device (LED) comprising:
a first-doped layer on a substrate;
an active layer on the first-doped layer, the active layer being configured to emit electron-hole pairs;
a second-doped layer on the active layer; and
a metal layer on the second-doped layer, wherein the second-doped layer is textured with a plurality of V-pits on a surface opposite to the active layer to define a surface plasmon thickness that is configured to allow the electron-hole pairs in the active layer to couple efficiently to a surface plasmon mode at an interface of the metal layer and the second-doped layer thereby increasing the spontaneous emission rate of the LED, and wherein light is emitted from a rear side of the LED when the metal layer has a thickness of approximately 30 nm or thicker, wherein the rear side comprises a surface of the substrate opposite the first-doped layer.

2. The LED of claim 1, wherein the active layer comprises one or more quantum well layers comprising material selected from semiconductor emitting material and organic molecules.

3. The LED of claim 1, wherein the substrate comprises a material selected from quartz, fused silica, silicon, sapphire and polymer.

4. The LED of claim 1, wherein the first-doped layer is an n-doped layer and the second-doped layer is a p-doped layer.

5. The LED of claim 1, wherein the first-doped layer comprises a material selected from the group comprising Si,Ge, SiC, GaAs, InGaP, InGaAs, InGaN, GaN, AlGaN, ZnSe, ZnCdSe, AlGaAs, InP and a molecule doped polymer, or wherein the second- doped layer comprises a material selected from the group comprising Si, Ge, SiC, GaAs, InGaP, InGaAs, InGaN, GaN, AlGaN, ZnSe, ZnCdSe, AlGaAs, lnP and a molecule doped polymer.

6. The LED of claim 1, wherein the active layer comprises a material selected from the group comprising Si,Ge, SiC, GaAs, InGaP, InGaAs, InGaN, GaN, AlGaN, ZnSe,ZnCdSe, CdS, AlGaAs and InP.

7. The LED of claim 1, wherein the metal layer comprises a metal selected from the group consisting of Au, Ag, Al, Cu, Ti, Ni, Cr, Zn, and an alloy formed from one or more of Au, Ag, Al, Cu, Ti, Ni, Cr, and Zn.

8. The LED of claim 1, wherein the metal layer is formed on a first portion of the second-doped layer but not on a second portion of the second-doped layer, or wherein the metal layer is formed on the first and second portions of the second-doped layer.

9. The LED of claim 1, wherein the metal layer comprises a random array of metal nanoparticles formed through annealing or spincoating of metallic nanoparticles;
or wherein the metal layer comprises patterned metallic nanostructures fabricated using lithography and deposition processes.

10. The LED of claim 1, wherein the second-doped layer is patterned with any one of the following: plasmonic nanostructures, metamaterial nanostructures, a structure of sub wavelength grating, a structure of nanoantennas, and a structure of nanoapertures.

11. The LED of claim 1, further comprising a first electrode in contact with the first-doped layer and an electrode layer forming a second electrode in contact with the second-doped layer, or comprising a phosphors layer on a surface of the LED.

12. The LED of claim 1, wherein the second-doped layer is textured with the plurality of V-pits on the surface opposite to the active layer to further define a second portion that is configured to form a p-n junction in the LED.

13. A method for fabricating a light emitting diode (LED), the method comprising:
depositing a first-doped GaN layer with first impurities on a substrate;
forming one or more quantum well layers on the first-doped layer;
depositing a second-doped GaN layer with second impurities on the quantum well layer;
depositing a metal layer over the second-doped layer,
wherein depositing the second-doped GaN layer comprises texturing a plurality of sharp V-pits so that a first portion of the second doped GaN layer has a first thickness and a second portion of the second doped GaN layer has a second thickness, the first thickness defining a surface plasmon thickness that is configured to allow electron-hole pairs in the one or more quantum well layers to couple efficiently to a surface plasmon mode at an interface of the metal layer and the second-doped layer for an increased spontaneous emission rate of the LED and the second thickness being determined to ensure formation of a p-n junction in the LED, and wherein a thinnest portion of the second-doped layer and a thinnest portion of the metal layer over the thinnest portion of the second doped layer both are within the surface plasmon coupling thickness.

14. The method of claim 13, further comprises forming an electrode pad being a first electrode in contact with the first-doped GaN layer and an electrode layer forming a second electrode in contact with the second-doped GaN layer.

15. The method of claim 13 wherein depositing the metal layer over the second-doped layer comprises at least one of depositing the metal layer over an electrode layer, annealing or spincoating of metallic nanoparticles.

16. A method for fabricating a light emitting diode (LED), the method comprising:
  depositing a first-doped GaN layer with first impurities on a substrate
  forming one or more quantum well layers on the first-doped layer;
  depositing a second-doped GaN layer with second impurities on the quantum well layer;
  depositing a metal layer over the second-doped layer; and
  avoiding the second-doped layer where an electrode layer is formed when depositing the metal layer over the second-doped layer, or avoiding a second portion of the second-doped layer when depositing the metal layer over the second-doped layer,
  wherein depositing the second-doped GaN layer comprises texturing a plurality of sharp V-pits so that a first portion of the second doped GaN layer has a first thickness and the second portion of the second doped GaN layer has a second thickness, the first thickness defining a surface plasmon thickness that is configured to allow electron-hole pairs in the one or more quantum well layers to couple efficiently to a surface plasmon mode at an interface of the metal layer and the second-doped layer for an increased spontaneous emission rate of the LED and the second thickness being determined to ensure formation of a p-n junction in the LED.

* * * * *